(12) United States Patent
Hong et al.

(10) Patent No.: US 10,564,679 B2
(45) Date of Patent: Feb. 18, 2020

(54) ELECTRONIC DEVICE MODULE, METHOD OF MANUFACTURING THE SAME AND ELECTRONIC APPARATUS

(71) Applicant: Samsung Electro-Mechanics Co., Ltd., Suwon-si (KR)

(72) Inventors: Suk Youn Hong, Suwon-si (KR); Jong In Ryu, Suwon-si (KR); Seung Hyun Hong, Suwon-si (KR); Jang Hyun Kim, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 0 days.

(21) Appl. No.: 16/181,485

(22) Filed: Nov. 6, 2018

(65) Prior Publication Data

US 2019/0310687 A1 Oct. 10, 2019

(30) Foreign Application Priority Data

Apr. 5, 2018 (KR) .................. 10-2018-0039595
Jun. 7, 2018 (KR) .................. 10-2018-0065419

(51) Int. Cl.
*G06F 1/16* (2006.01)
*H05K 1/02* (2006.01)
*H01L 23/10* (2006.01)
*H01L 23/31* (2006.01)

(52) U.S. Cl.
CPC .......... *G06F 1/1656* (2013.01); *G06F 1/1698* (2013.01); *H01L 23/10* (2013.01); *H01L 23/3114* (2013.01); *H05K 1/023* (2013.01)

(58) Field of Classification Search
CPC . H01L 23/31; H01L 23/552; H01L 2924/181; H05K 3/284; H05K 1/0216; H05K 1/023; H05K 1/0236
See application file for complete search history.

(56) References Cited

U.S. PATENT DOCUMENTS

| | | | | |
|---|---|---|---|---|
| 5,847,931 A | * | 12/1998 | Gaumet | G06K 19/07745 361/737 |
| 5,907,477 A | * | 5/1999 | Tuttle | H01L 23/24 174/260 |
| 6,472,878 B1 | * | 10/2002 | Bruchmann | G01R 15/202 324/117 H |
| 6,515,468 B1 | * | 2/2003 | Morimoto | G01R 15/207 324/117 H |
| 8,988,885 B2 | * | 3/2015 | Sawatari | H01L 23/552 174/255 |

(Continued)

FOREIGN PATENT DOCUMENTS

| | | |
|---|---|---|
| JP | 5840658 B2 | 1/2016 |
| JP | 6121637 B2 | 4/2017 |
| WO | WO 2016/181954 A1 | 11/2016 |

*Primary Examiner* — Adrian S Wilson
(74) *Attorney, Agent, or Firm* — NSIP Law

(57) ABSTRACT

An electronic device module includes a substrate, a first component disposed on a first surface of the substrate, a sealing portion disposed on the first surface of the substrate, a second component disposed on the first surface of the substrate and embedded in the sealing portion, and a shielding wall at least partially disposed between the first component and the second component and including a portion having a height, with respect to the first surface of the substrate, that is lower than a height of the sealing portion.

20 Claims, 7 Drawing Sheets

(56) References Cited

U.S. PATENT DOCUMENTS

| | | | | |
|---|---|---|---|---|
| 2003/0189814 A1* | 10/2003 | Kato | ............... | H01L 23/544 361/715 |
| 2004/0080308 A1* | 4/2004 | Goto | ............... | G01R 15/202 324/117 H |
| 2004/0178500 A1* | 9/2004 | Usui | ............... | H01L 23/49822 257/734 |
| 2006/0022664 A1* | 2/2006 | Hill | ............... | G01R 1/18 324/750.27 |
| 2011/0013349 A1* | 1/2011 | Morikita | ............... | H05K 1/0218 361/679.02 |
| 2011/0229708 A1* | 9/2011 | Asami | ............... | H01L 23/295 428/316.6 |
| 2011/0249416 A1* | 10/2011 | Takai | ............... | H05K 3/284 361/760 |
| 2013/0014983 A1* | 1/2013 | Korson | ............... | H05K 9/0024 174/378 |
| 2014/0126161 A1 | 5/2014 | Chen et al. | | |
| 2014/0334119 A1* | 11/2014 | Ho | ............... | H05K 9/0039 361/753 |
| 2014/0362543 A1* | 12/2014 | Jang | ............... | H05K 1/023 361/748 |
| 2015/0293150 A1* | 10/2015 | Wand | ............... | G01R 1/18 361/818 |
| 2015/0325529 A1* | 11/2015 | Choi | ............... | H01L 23/13 257/723 |
| 2015/0382448 A1* | 12/2015 | Pennathur | ............... | H05K 1/0203 361/679.54 |
| 2016/0021737 A1* | 1/2016 | Oh | ............... | H05K 3/284 361/772 |
| 2017/0243832 A1* | 8/2017 | Hong | ............... | H01L 21/32051 |
| 2017/0354039 A1 | 12/2017 | Miwa | | |
| 2018/0092257 A1 | 3/2018 | Otsubo et al. | | |

\* cited by examiner

I-I'

ELECTRONIC DEVICE MODULE, METHOD OF MANUFACTURING THE SAME AND ELECTRONIC APPARATUS

CROSS-REFERENCE TO RELATED APPLICATIONS

This application claims the benefit under 35 USC 119(a) of Korean Patent Application No. 10-2018-0039595 filed on Apr. 5, 2018 and Korean Patent Application No. 10-2018-0065419 filed on Jun. 7, 2018 in the Korean Intellectual Property Office, the entire disclosures of which are incorporated herein by reference for all purposes.

BACKGROUND

1. Field

The following description relates to an electronic device module and a method of manufacturing an electronic device. For example, the following description is related to an electronic device module in which a passive component, a semiconductor chip, or the like, included in a module, may be protected from an external environment while electromagnetic waves are blocked, and a method of manufacturing such an electronic device.

2. Description of Related Art

In the electronic products market, consumption of portable electronic products has increased rapidly, and there has accordingly been demand for small, lightweight electronic components to be provided in portable electronic product systems.

To meet such a demand, it has been necessary to use a technique for reducing the sizes of individual components, and also, a system-on-chip (SOC) technique that integrates individual components into a single chip, or a system-in-package (SIP) technique that integrates individual components into a single package.

Particularly, in the case of a high frequency electronic device module using a high frequency signal, such as a communications module or a network module, it has been necessary to provide electromagnetic wave shielding structures having various forms to successfully implement shielding properties in relation to electromagnetic wave interference, along with miniaturization.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, an electronic device module includes a substrate, a first component disposed on a first surface of the substrate, a sealing portion disposed on the first surface of the substrate, a second component disposed on the first surface of the substrate and embedded in the sealing portion, and a shielding wall at least partially disposed between the first component and the second component and including a portion having a height, with respect to the first surface of the substrate, that is lower than a height of the sealing portion.

The shielding wall and the first component may be spaced apart, and the sealing portion may be disposed between the shielding wall and the second component.

The shielding wall may be a square ring, and the first component may be disposed in an internal space defined by the shielding wall.

The shielding wall may include two walls connected to each other, and at least one of the two walls may be disposed between the first component and the second component.

The shielding wall may extend across an entire width of the first surface of the substrate.

The substrate may include a ground electrode, and the shielding wall may be bonded to the ground electrode.

A shielding layer may be disposed along a surface of the sealing portion.

The shielding layer may be connected to an upper end of the shielding wall.

The shielding layer and the shielding wall may be formed of different materials.

The sealing portion may include a first sealing portion without the shielding layer and connected to the shielding wall, a second sealing portion provided with the shielding layer, and a third sealing portion without the shielding layer and having a thickness, with respect to the first surface of the substrate, that is less than a thickness of the first sealing portion and a thickness of the second sealing portion. An antenna may be disposed on or in a portion of the substrate that overlaps the third sealing portion.

In another general aspect, a method of manufacturing an electronic device module includes mounting a first component and a second component on a first surface of a substrate, mounting a shielding case formed of a conductive material and defining a receiving space on the first surface of the substrate so that the first component is accommodated in the receiving space, disposing a sealing portion sealing the second component and the shielding case on the first surface of the substrate; and exposing the receiving space to the outside of the sealing portion by partially removing the sealing portion and the shielding case.

The method may include forming a shielding layer on a surface of the sealing portion before exposing the receiving space to the outside of the sealing portion.

Forming the shielding layer may include partially exposing the shielding case by partially removing the sealing portion, and disposing the shielding layer on a surface of the sealing portion and the partially exposed shielding case.

Partially exposing the shielding case may be performed by removing an upper surface of the sealing portion using a grinder until the shielding case is exposed.

Partially exposing the shielding case may be performed by exposing only a portion of the shielding case that corresponds to a wall disposed between the first component and the second component using a blade or a laser.

Exposing the receiving space to the outside of the sealing portion may include partially removing the sealing portion and the shielding case using a grinder.

In another general aspect, an apparatus includes an electronic device module that includes a substrate, a first component disposed on a first surface of the substrate, a sealing portion disposed on the first surface of the substrate, a second component disposed on the first surface of the substrate and embedded in the sealing portion, a shielding structure at least partially disposed between the first component and the second component, and an antenna disposed on a second surface of the substrate or inside the substrate at a position that overlaps the first component.

The shielding structure may include a first wall disposed between the first component and the second component.

The first wall may have a height above the first surface of the substrate that is shorter than a height of the sealing portion.

The shielding structure may include a second wall, the first wall may have a height above the first surface of the substrate that is equal to a height of the sealing portion, and the second wall may have a height above the first surface of the substrate that is shorter than the height of the sealing portion.

Other features and aspects will be apparent from the following detailed description, the drawings, and the claims.

BRIEF DESCRIPTION OF DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
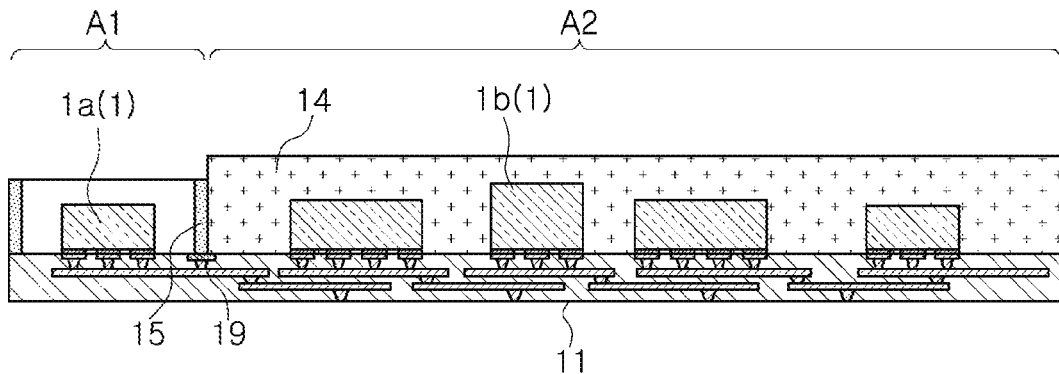
FIG. 1 is a cross-sectional view of an electronic device module according to an example.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Herein, it is noted that use of the term "may" with respect to an example or embodiment, e.g., as to what an example or embodiment may include or implement, means that at least one example or embodiment exists in which such a feature is included or implemented while all examples and embodiments are not limited thereto.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

Figure 2:
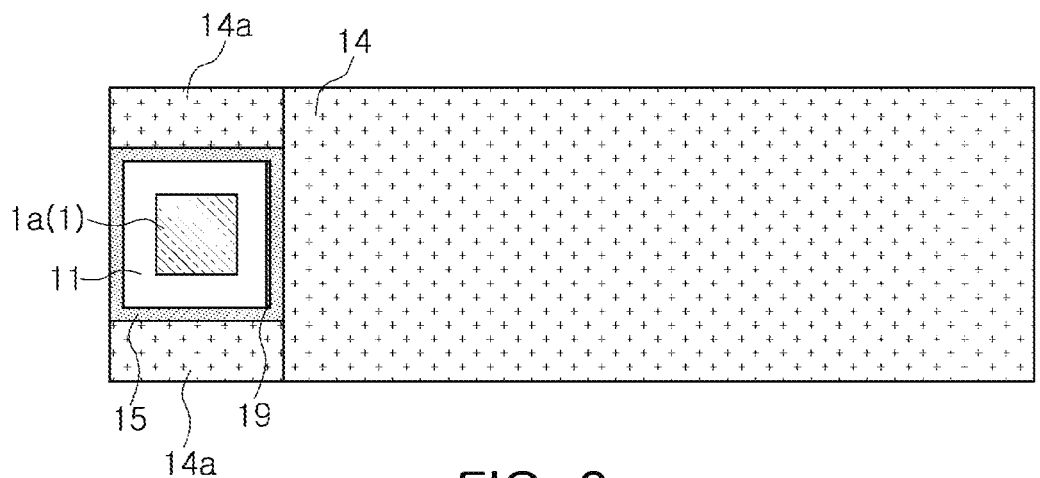
FIG. 2 is a top view of the electronic device module illustrated in FIG. 1.

FIG. 1 is a cross-sectional view of an electronic device module according to an example. FIG. 2 is a top view of the electronic device module in FIG. 1.

Referring to FIGS. 1 and 2, an electronic device module 100 may include a substrate 11, electronic components 1, a sealing portion 14, and a shielding wall 15.

On a first surface of the substrate 11, electrodes for mounting the electronic components 1, a ground electrode 19, and, although not illustrated, a wiring pattern in which the electrodes for mounting the electronic components 1 are electrically connected to each other, may be formed.

The at least one electronic component 1 may be mounted on the electrode for mounting the electronic components 1.

The ground electrode 19 may be electrically connected to the shielding wall 15.

The ground electrode 19 may be disposed only between a first component 1a and a second component 1b and connected to the shielding wall 15. However, the disclosure is not limited to such a configuration. The ground electrode 19 may be configured to be formed along an overall shape of the shielding wall 15, and be connected to an overall area of the shielding wall 15, or other various modifications may be possible.

The ground electrode 19 may be formed in solid line form, but is not limited to such a configuration. The ground electrode 19 may have various forms as long as the ground electrode 19 is able to be connected to the shielding wall 15. For example, the ground electrode 19 may be formed a broken line or a dotted line.

Although not illustrated in detail, the electrode for mounting the electrode component 1 or the ground electrode 19 may be protected by protective insulation layers (not illustrated) disposed in layers on an upper portion of the substrate 11, and may be exposed externally through an opening formed in the protective insulation layer. As the protective insulation layer, a solder resist may be used, but the protective insulation layer is not limited to such a configuration.

As the substrate 11, various types of circuit substrates (e.g., a ceramic substrate, a printing circuit substrate, a flexible substrate, and the like) generally used in the respective technical field may be used. The substrate 11 may be a multilayer substrate 11 having a plurality of layers, and a circuit pattern may be formed between the layers.

An antenna wiring may be formed on a second surface, such as a lower surface, of the substrate 11, or inside the substrate 11.

The electronic components 1 may include a variety of electronic devices such as a passive device and an active device. The electronic components 1 may be electronic components able to be mounted on or in the substrate 11. The electronic components are not limited to such devices, but may also include various components such as a connector.

The electronic components 1 may include at least one second component 1b embedded in the sealing portion 14, and at least one first component 1a disposed on the outside of the sealing portion 14, and not embedded in the sealing portion. For example, the first component 1a may be a connector, and the second component 1b may be an electronic device, but the electronic components 1 are not limited to such a configuration.

The sealing portion 14 may be disposed in the first surface of the substrate 11, and may seal one or more of the electronic components 1, such as the second component 1b. The sealing portion 14 may fix the electronic components 1 by sealing the component externally, thereby protecting the electronic components 1 safely from an external impact. The first component 1a may be disposed on the outside of the sealing portion 14, without being embedded in the sealing portion 14.

The sealing portion 14 may be formed of an insulation material. For example, the sealing 14 may be formed of a resin material such as an epoxy molding compound (EMC), but is not limited to such a material. The sealing portion 14 may be formed of a conductive material (e.g., a conductive resin, and the like). An individual sealing portion, such as an underfill resin, may be provided between the second component 1b and the substrate 11.

The shielding wall 15 may be disposed between the sealing portion 14 and the first component 1a, and block electromagnetic waves flowing into the second component 1b from the first component 1a or flowing into the first component 1a from the second component 1b. The shielding wall 15 may be formed of a conductive material, and electrically connected to the ground electrode 19 on the substrate 11. For example, the shielding wall 15 may be a metal plate, and may be bonded to the ground electrode 19 on the substrate 11 by a conductive adhesive agent such as a solder or a conductive resin.

The shielding wall 15 may be formed to have a shape of a square ring completely sealing the first component 1a, and an internal area of the shielding wall 15 may be formed to have a shape of an empty pipe.

The shielding wall 15 may prevent a material (e.g., a molding resin) of the sealing portion 14 from flowing into the first component 1a when the sealing portion 14 is formed in the process of manufacturing the electronic device module. The first component 1a may not be embedded in the sealing portion 14 due to the shielding wall 15.

The shielding wall 15 may be formed to have a shape of a square ring. However, the shape of the shielding wall is not limited to such a shape. The shielding wall 15 may have various forms as long as a flow of electromagnetic waves is able to be shielded between the first component 1a and the second component 1b. For example, the shielding wall 15 may be formed to have a shape of a circular ring, an oval ring, a polygonal ring, or the like.

A mounting height of the shielding wall 15 may be configured to be equal to or higher than a height of the first component 1a.

A mounting height of the shielding wall 15 may be configured to be lower than a height of the sealing portion 14. The shielding wall 15 may be formed using a shielding case 15a (in FIG. 4). A process of partially removing the shielding case 15a may need to be performed, and a mounting height of the shielding wall 15 may be configured to be lower than a height of the sealing portion 14.

Figure 14:
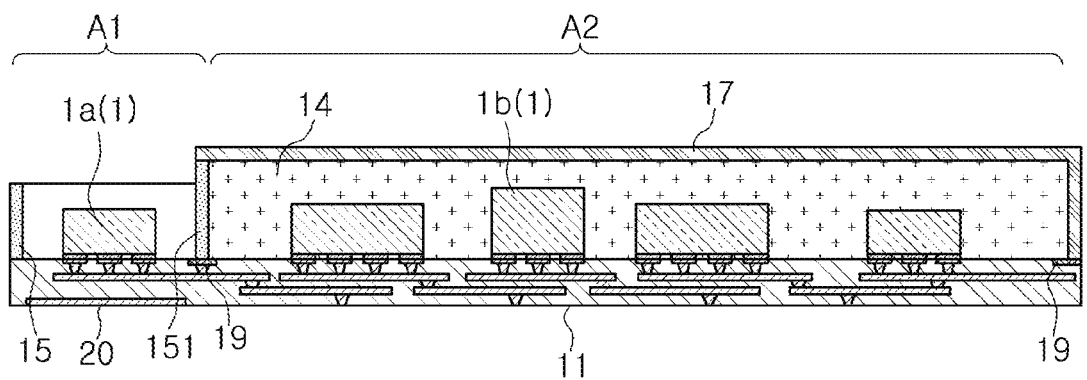
FIG. 14 is a cross-sectional view of an electronic device module according to an example.

However, as in the example of FIG. 14, a height of a portion of the shielding wall 15 may be configured to be equal to a height of the sealing portion 14. However, a height of the other portion of the shielding wall 15 may be configured to be lower than the height of the sealing portion 14.

A mounting height of a portion of the shielding wall 15 may be configured to be lower than a height of the sealing portion 14.

A method of manufacturing an electronic device module according to an example will be described below.

FIGS. 3 to 6 are views illustrating processes in a method of manufacturing an electronic device module.

Figure 3:
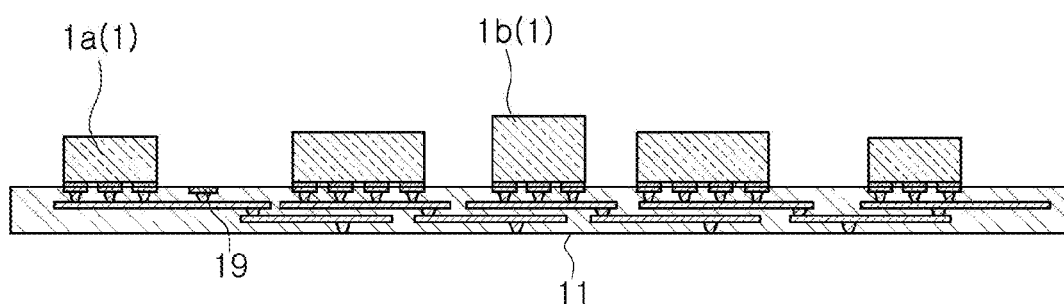
FIGS. 3 to 6 are views illustrating processes in a method of manufacturing an electronic device module.

As illustrated in FIG. 3, the electronic components 1 may be mounted on a first surface of the substrate 11.

The substrate 11 may be a multilayer circuit substrate 11 having a plurality of layers, and an electrically connected circuit pattern may be formed between the layers.

The electronic components 1 may be bonded to the substrate 11 through a conductive adhesive agent such as a solder.

Figure 4:
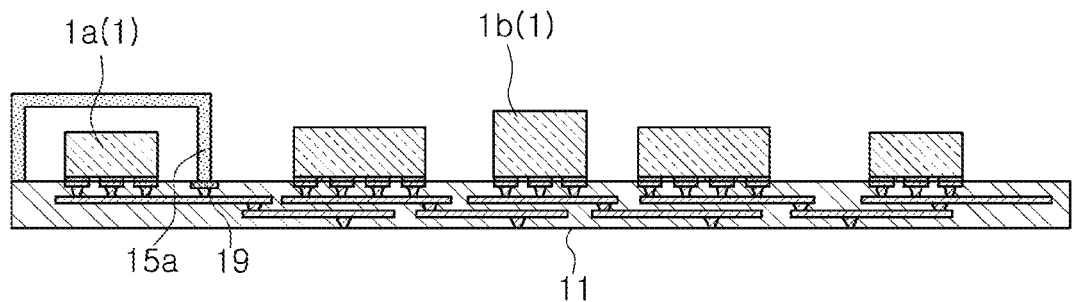

A shielding case 15a may be mounted on the first surface of the substrate 11 as illustrated in FIG. 4.

The shielding case 15a may be formed of a conductive material, and may be formed in a form of a container of which one surface is opened, and a receiving space may be provided therein.

The shielding case 15a may be formed to have a shape of a rectangular parallelepiped of which one surface is opened. However, the shape of the shielding case 15a is not limited to such a shape. The shielding case 15a may have various forms as long as a receiving space in which the first component 1a is able to be placed is provided in the shielding case 15a. For example, the shielding case 15a may be formed to have a shape of a cylinder, a polygon column, or the like.

The shielding case 15a may be mounted on the substrate 11 such that the first component 1a is placed in the internal receiving space. The opened surface of the shielding case 15a may be bonded to the first surface of the substrate 11. At least a portion of the shielding case 15a may be connected to the ground electrode 19.

In the example, the electronic components 1 are mounted on the substrate 11, and then the shielding case 15a is mounted on the substrate 11. However, the disclosure is not limited to such a process.

For example, after a conductive paste is coated to the substrate 11, the electronic components 1 and the shielding case 15a may be disposed on the conductive paste, and the electronic components 1 and the shielding case 15a may be bonded to the substrate 11 at the same time through a reflow soldering process.

Figure 5:
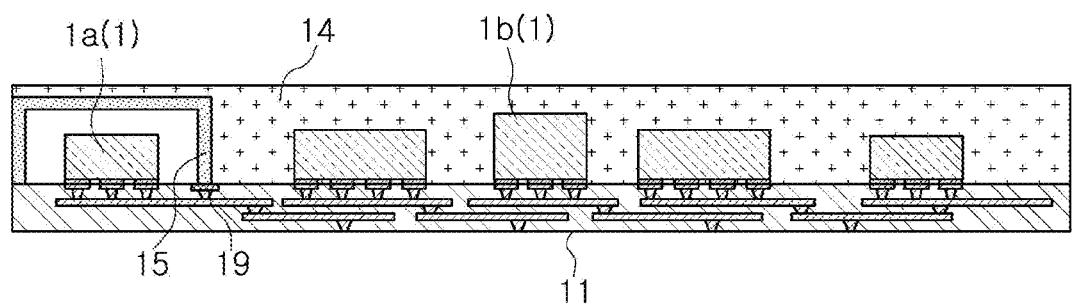

As illustrated in FIG. 5, the sealing portion 14 may be formed on the first surface of the substrate 11 by sealing the electronic components 1.

The sealing portion 14 may be formed on an overall area of the first surface of the substrate 11. The sealing portion 14 may be formed such that one or more of the electronic components 1, including the second component 1b, and also the shielding case 15a covering the first component 1a may be embedded in the sealing portion 14.

A material (e.g., a molding resin) forming the sealing portion 14 may not be flowed into the internal space of the shielding case 15a because of the shielding case 15a. Thus, the first component 1a may not be in contact with the material forming the sealing portion 14.

The sealing portion 14 may be formed by a transfer molding method, but the disclosure is not limited to such a method.

Figure 6:
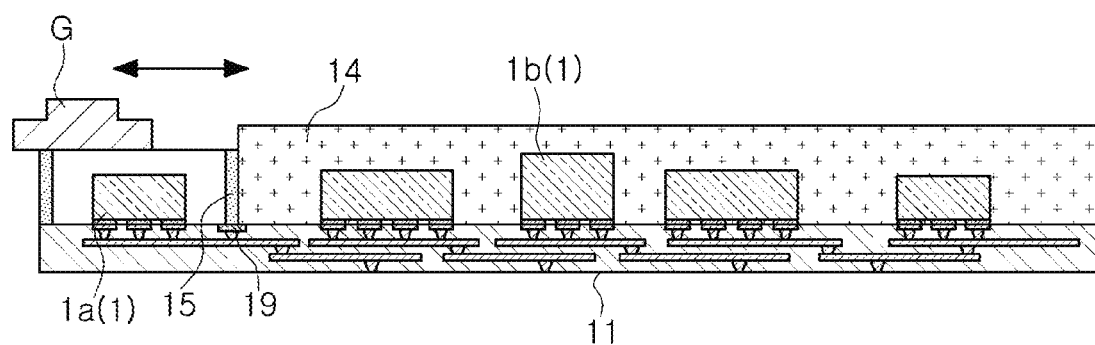

As illustrated in FIG. 6, the sealing portion 14 and the shielding case 15a may be partially removed. The removed portion may be a first area A1 (in FIG. 1) in which the shielding case 15a is disposed, while a second area A2 (in FIG. 2) in which the second component 1b is disposed may not be removed.

The sealing portion 14 may be removed by reducing a thickness of the sealing portion 14. A grinder may be used to remove the sealing portion 14. However, the disclosure is not limited to use of a grinder.

As the first area A1 is partially removed, a thickness of the first area A1 may be different from that of the second area A2.

The first area A1 of the sealing portion 14 may be removed until the internal space of the shielding case 15a is exposed to the outside. The first component 1a may be exposed to the outside.

Once the sealing portion 14 is removed, the shielding case 15a may be changed to a shielding wall 15 having a shape of a pipe or a ring.

The overall first area A1 may be partially removed. Thus, not only the sealing portion 14 disposed on an upper portion of the shielding case 15a, but also the sealing portions 14a (in FIG. 2) disposed on both sides of the shielding case 15a may be partially removed. A stepped portion may be formed between the sealing portion 14a in the first area A1 and the sealing portion 14 in the second area A2.

Since a height of the sealing portion 14a in the first area A1 may be lower than a height of the sealing portion 14 in the second area A2, an electronic component may not be mounted in the sealing portion 14a in the first area A1, or only electronic components having a mounting height lower than a mounting height of the shielding wall 15 may be mounted in the first area A1.

In the electronic device module manufactured through the processes as above, a shielding wall may be disposed between the first component and the second component, and thus, electromagnetic wave interference occurring between the first component and the second component may be prevented.

As the shielding wall is formed between the first component and the second component using the shielding case, the shielding wall may be easily mounted and manufactured.

When manufacturing the sealing portion, the shielding wall may perform a function of shielding a flow of the sealing portion. Thus, a gap between the sealing portion and the first component may be significantly reduced.

Considering the case in which the sealing portion is only formed in the second component using a mold, not using the shielding case 15a, a mold frame may need to be disposed between the first component and the second component. Thus, the first component and the second component may need to be spaced apart from each other by a distance equal to or greater than a thickness of the molding frame.

However, in the case in which the shielding wall is formed using a shielding case, it may not be necessary to dispose a mold frame between the first component and the second component. Accordingly, a distance between the first component and the second component may be significantly reduced, and an overall size of the electronic device module may be significantly reduced as well.

The electronic device module according to the disclosure is not limited to the aforementioned configurations, but various modifications thereof may be possible.

Figure 7:
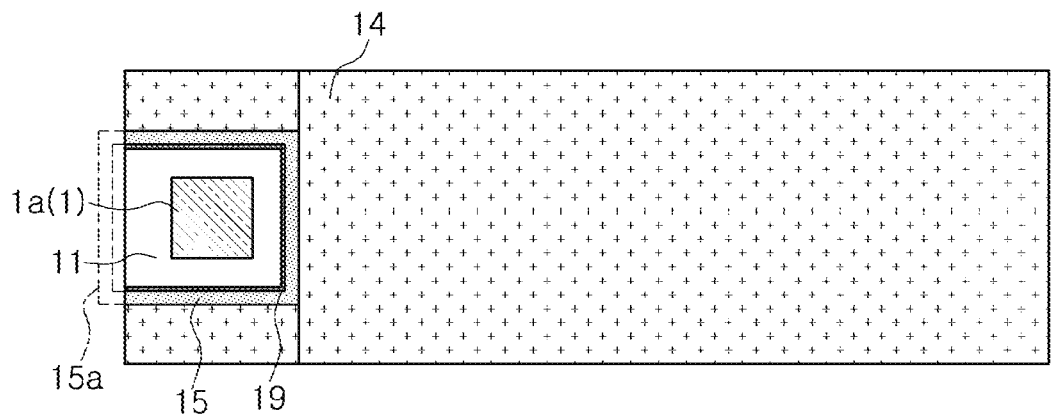
FIGS. 7 to 9 are top views of an electronic device module according to an example.
Figure 8:
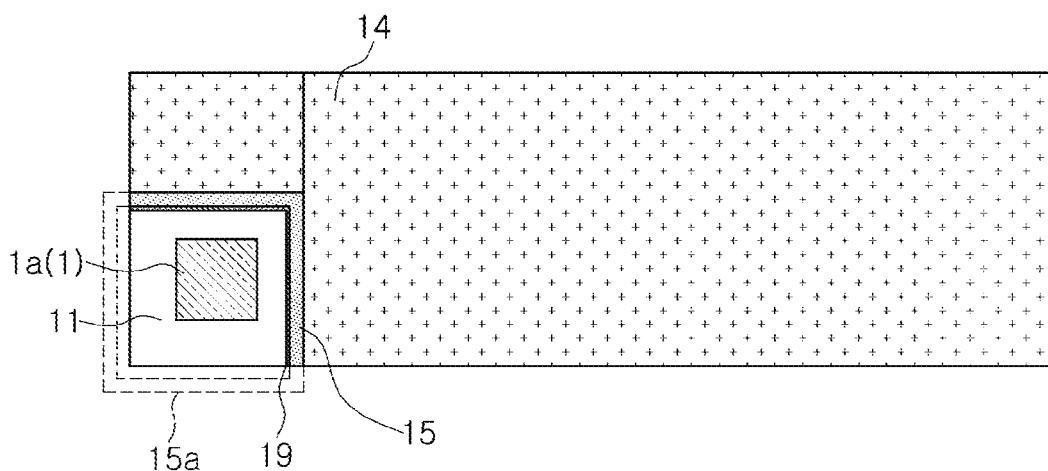
Figure 9:
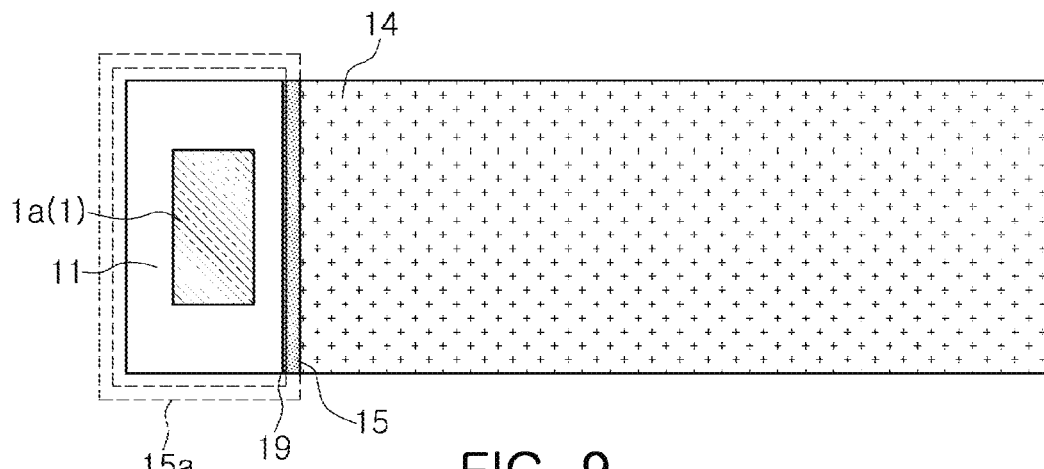

FIGS. 7 to 9 are top views of an electronic device module according to an example.

In the electronic device module illustrated in FIGS. 7 and 8, a shielding wall 15 may include at least two shielding walls connected to each other, and at least one of the shielding walls may be disposed between the first component 1a and the second component 1b.

Referring to FIG. 7, the electronic device module may be configured similarly to the electronic device module in the aforementioned examples, and the shielding wall 15 may be formed in a form of "⊏" (or "C") with one surface being removed, and not being formed in a square ring. Three walls connected to one another may be included, and one of the three walls may be disposed between the first component 1a and the second component 1b.

The electronic device module may be manufactured by removing one of four shielding walls 15 of the shielding case 15a by the process of dicing after the shielding case 15a (in FIG. 4) has been mounted on the substrate 11.

The ground electrode 19 may be bonded to an overall area of the shielding wall 15 in FIG. 7.

Referring to FIG. 8, the shielding wall 15 may not be formed to have a shape of a square ring, but may be formed to have an "L" shape with two surfaces being removed. Two walls connected to each other may be included, and one of the walls may be disposed between the first component 1a and the second component 1b.

The electronic device module may be manufactured by removing two shielding walls 15 among four shielding walls 15 of the shielding case 15a by the process of dicing after the shielding case 15a has been mounted on the substrate 11.

The ground electrode 19 may be connected to an overall area of the shielding wall 15 in FIG. 8.

Referring to FIG. 9, the shielding wall 15 may be formed to have a shape of "|" with three surfaces being removed, and not in a shape of a square ring. The shielding wall 15 may be disposed to cross the substrate 11.

The electronic device module may be manufactured by removing three shielding walls 15 among four shielding walls 15 of the shielding case 15 by the process of dicing after the shielding case 15a has been mounted on the substrate 11.

The configurations illustrated in FIGS. 7 to 9 may be formed by, after disposing one to three surfaces of the shielding case 15a in a dummy area on a substrate strip, removing a surface formed in the dummy area, along with the dummy area on the substrate, in the process of collectively manufacturing a plurality of electronic device modules on the strip-shaped substrate.

Figure 10:
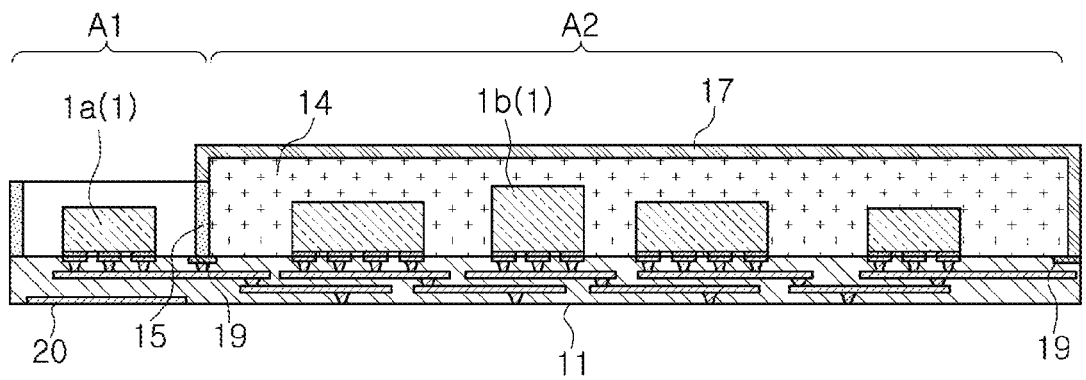
FIG. 10 is a cross-sectional view of an electronic device module according to an example.

FIG. 10 is a cross-sectional view of an electronic device module according to an example.

Referring to FIG. 10, a shielding layer 17 may be disposed along a surface of a sealing portion 14 disposed in a second area A2.

The shielding layer 17 may be formed on a surface of the sealing portion 14, and may block electromagnetic waves flowing into the second component 1b from the outside or leaking from the second component 1b to the outside. The shielding layer 17 may be formed of a conductive material, and electrically connected to a ground electrode 19 on the substrate 11.

To electrically connect the shielding layer 17 with the ground electrode 19 on the substrate 11, at least a portion of the ground electrode 19 may be exposed to the outside. The configuration may be achieved by limiting a position and a size of the sealing portion 14, or by partially removing the sealing portion 14 in the process of manufacturing the sealing portion 14 to allow the ground electrode 19 to be partially exposed.

The ground electrode 19 may be configured to be exposed to a side surface of the substrate 11, and the shielding wall 17 may be extended up to the side surface of the substrate 11 so that the ground electrode 19 is able to be in contact with the shielding layer 17 on the side surface of the substrate 11, or other various modifications may be possible.

The shielding layer 17 may be formed by coating an external surface of the sealing portion 14 with a resin material including a conductive powder, or by forming a metal thin film. In the case of forming a metal thin film, various methods, such as a sputtering method, a vapor deposition method, an electroplating process, an electroless plating process, and the like, may be used.

For example, the shielding layer 17 may be a metal thin film formed on an external surface of the sealing portion 14 by a spray coating method. By the spray coating method, an evenly coated film may be formed, and costs, in terms of infrastructure investment, may be relatively lower than other processes. However, the disclosure is not limited to such a method or process. The metal thin film may also be formed using a sputtering method.

The shielding layer 17 may be electrically connected to the shielding wall 15. The shielding layer 17 may be bonded to an upper end of the shielding wall 15. Both the shielding layer 17 and the shielding wall 15 may be formed of a conductive material (e.g., Cu, Ag, Au, Ni, Pt, or Pd, or alloys thereof), but may also be formed of different materials, as the shielding layer 17 and the shielding wall 15 are formed through different processes. However, the shielding layer 17 and the shielding wall 15 may be formed of the same material.

An antenna 20 may be disposed on the substrate 11. The antenna 20 may be disposed in a position corresponding to a first area A1 and be between two surfaces of the substrate 11. In the case in which the antenna 20 is disposed in the second area A2, a wireless signal transmitted and received via the antenna 20 may be shielded by the shielding layer 17. Thus, the antenna 20 may be disposed only in the first area A1 in which the shielding layer 17 is not present.

In the case in which the antenna 20 is configured to radiate a wireless signal to a lower portion of the substrate 11, the antenna 20 may be disposed in the second area A2.

For example, in the case of disposing a dipole antenna radiating a wireless signal in a direction parallel the substrate 11, it may be favorable to dispose the antenna in the first area A1. However, in the case of disposing a patch antenna radiating a wireless signal in a lower portion direction among directions perpendicular to the substrate 11, it may be possible to dispose the antenna in the second area A2.

The antenna 20 may be formed using a circuit pattern formed on the substrate 11. However, the antenna is not limited to such a configuration. An individually manufactured antenna component may be mounted on the second surface of the substrate 11 and used, or other various modifications may be possible.

A method of manufacturing an electronic device module will be described below.

Figure 11:
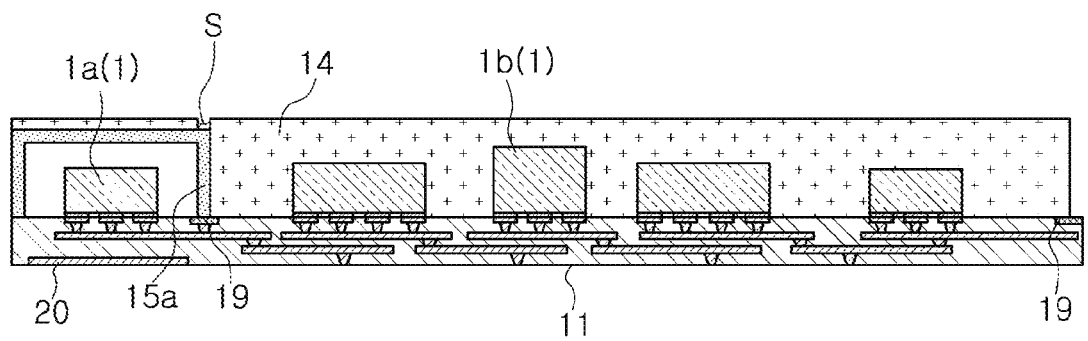
FIGS. 11 to 13 are views illustrating a method of manufacturing the electronic device module illustrated in FIG. 10.
Figure 12:
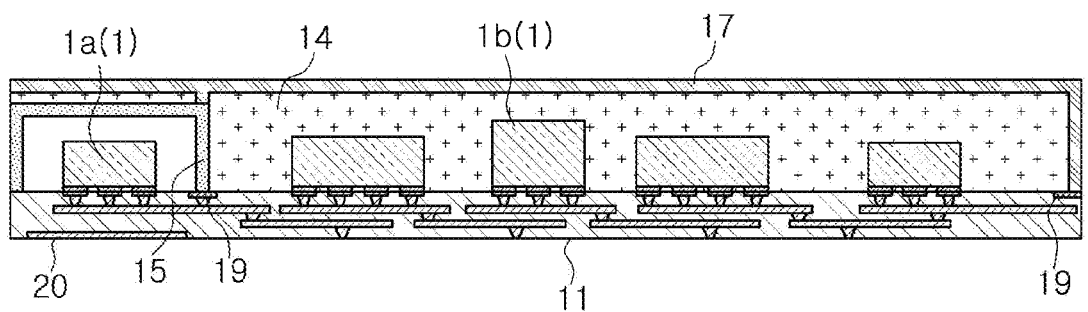
Figure 13:
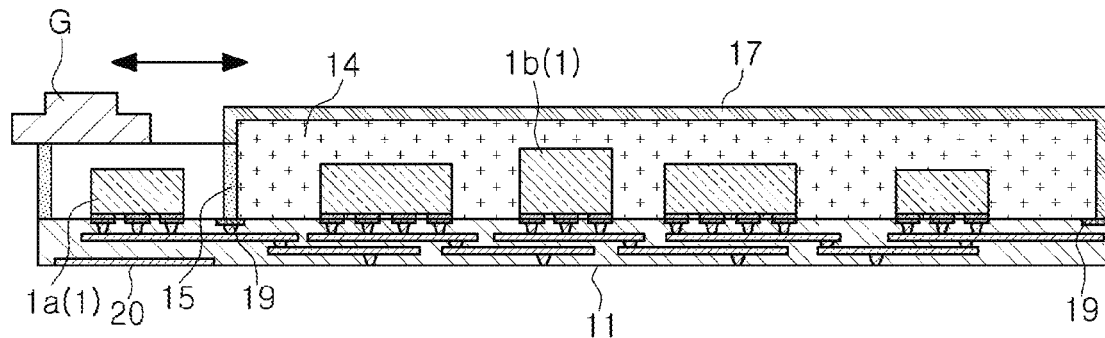

FIGS. 11 to 13 are views illustrating a method of manufacturing the electronic device module in FIG. 10. In the processes of the method of manufacturing an electronic device module, a sealing portion 14 in a first area A1 may be removed in steps.

The method of manufacturing an electronic device module may be performed as in the aforementioned examples with respect to the configurations in FIGS. 1 to 5.

Once the sealing portion 14 is formed, as illustrated in FIG. 5, a primary removing process in which a shielding case 15a disposed between a first component 1a and a second component 1b is exposed may be undertaken, as illustrated in FIG. 11. Only a portion of the sealing portion 14, the portion disposed on an upper portion of a shielding wall disposed between the first component 1a and the second component 1b, may be removed.

The sealing portion 14 may be removed using a blade (not illustrated) or a laser used to cut or dice a module, and only a portion of the shielding case 15a, the portion disposed between the first component 1a and the second component 1b, may be exposed.

The sealing portion 14 removed in this process may be removed in a range of a width equal or similar to a width of a shielding wall 15 (in FIG. 10), and once the sealing portion 14 is removed, an upper portion of the shielding wall 15 may be formed as an empty space (S).

As illustrated in FIG. 12, a shielding layer 17 may be formed. The shielding layer 17 may be formed by coating an external surface of the sealing portion 14 with a resin material including a conductive powder, or by forming a metal thin film. In the case of forming a metal thin film, various methods, such as a sputtering method, a vapor deposition method, an electroplating process, an electroless plating process, and the like, may be used.

The shielding layer 17 may be applied to the empty space S in the sealing portion 14, and may be connected to the shielding wall 15.

A secondary removing process in which the sealing portion 14 is partially removed may be undertaken as illustrated in FIG. 13. The removed portion in this process may be the first area A1 (in FIG. 1) in which the shielding case 15a is disposed, while the second area A2 (in FIG. 2) in which the second component 1b is disposed may not be removed. The shielding layer 17 formed on an upper portion of the shielding wall 15 may not be removed.

The shielding layer 17 and the shielding wall 15 may be indirectly connected to each other through the ground electrode 19 on the substrate 11, the shielding layer 17 may not be directly connected to the shielding wall 15, or other various modifications may be possible.

FIG. 14 is a cross-sectional view of an electronic device module according to an example.

Referring to FIG. 14, a height of a portion 151 (hereinafter, referred to as a first shielding wall 151) of a shielding wall 15 sealing a first component 1a, the portion disposed between a first component 1a and a second component 1b, may be configured to be higher than a height of the other portion of the shielding wall 15.

A height of the first shielding wall 151 may be configured to be equal to a height of a sealing portion 14 disposed in the first area A1. The shielding layer 17 may be connected to the first shielding wall 151 on the same upper surface of the sealing portion 14.

The sealing portion may be removed in steps.

Figure 15:
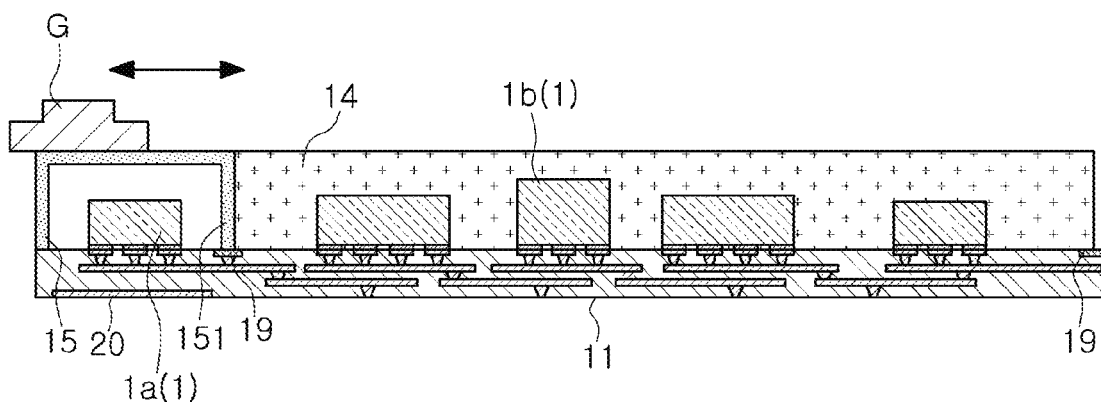
FIGS. 15 to 17 are views illustrating a method of manufacturing the electronic device module illustrated in FIG. 14.
Figure 16:
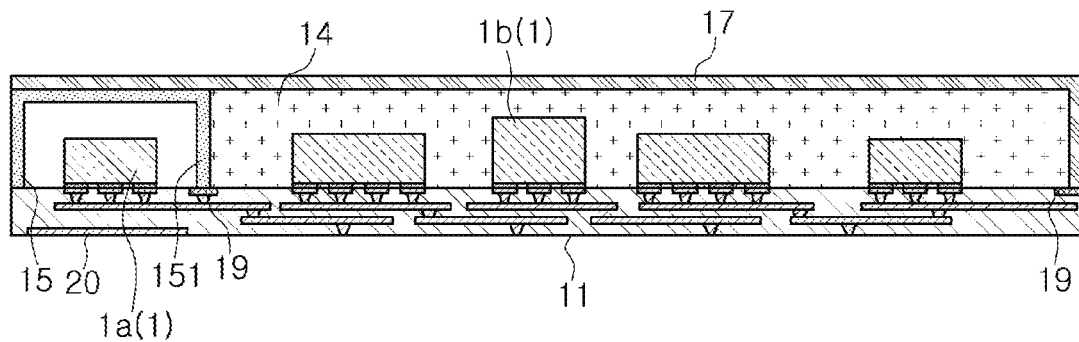
Figure 17:
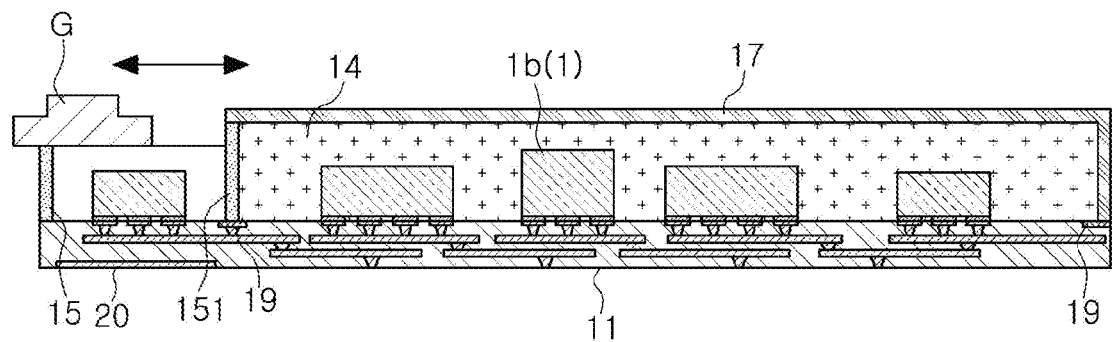

FIGS. 15 to 17 are views illustrating a method of manufacturing the electronic device module in FIG. 14.

From the state in FIG. 5, a primary removing process in which an overall upper surface of a sealing portion 14 is removed to be planar using a grinder until a shielding case 15a is exposed may be undertaken, as illustrated in FIG. 15. A first component 1a may not be exposed to the outside.

As illustrated in FIG. 16, a process of connecting the shielding layer 17 with the exposed shielding case by forming the shielding layer 17 on a surface of the sealing portion 14 may be undertaken.

As illustrated in FIG. 17, a secondary removing process in which the shielding case 15a and the sealing portion 14 are partially removed to allow the first component 1a in the first area A1 to be exposed to the outside may be undertaken. The shielding wall 15 connected to the shielding layer 17 may not be removed.

The shielding layer 17 and the shielding wall 15 may be indirectly connected to each other through the ground electrode 19 on the substrate 11, the shielding layer 17 may not be directly connected to the shielding wall 15, or other various modifications may be possible.

Figure 18:
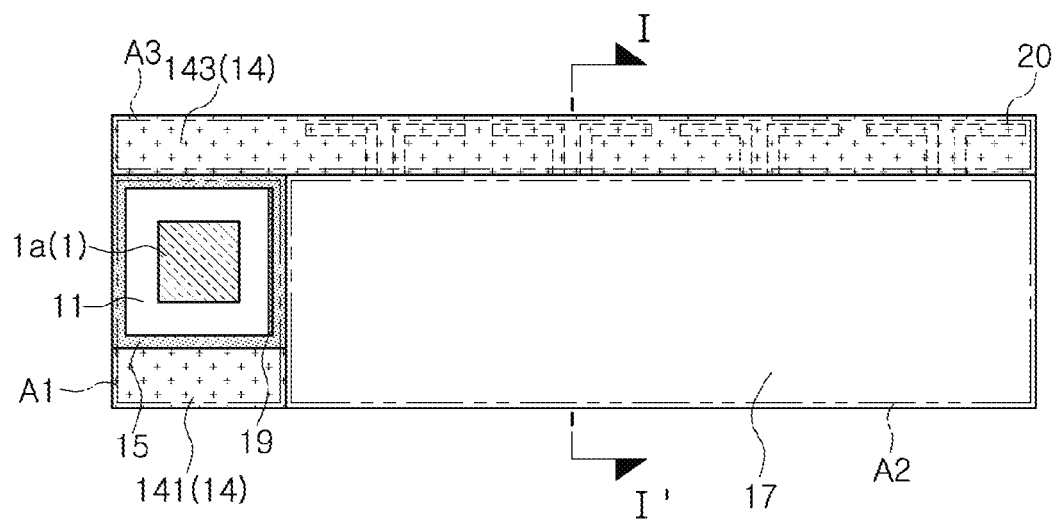
FIG. 18 is a top view of an electronic device module according to an example.
Figure 19:
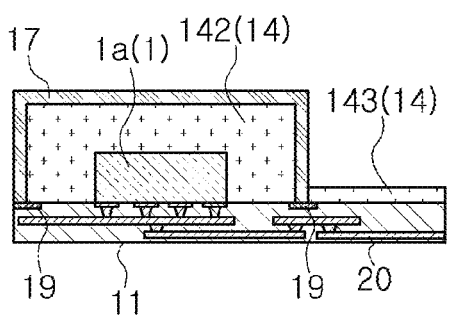
FIG. 19 is a cross-sectional view taken along line I-I' in FIG. 18.

FIG. 18 is a top view of an electronic device module according to an example. FIG. 19 is a cross-sectional view taken along line I-I' in FIG. 18.

Referring to FIG. 18, the electronic device module may include an antenna 20. An area of the electronic device module may be divided into a first area A1 in which a first component 1a is disposed, a second area A2 in which a shielding layer 17 is disposed, and a third area A3 in which the antenna 20 is disposed.

A sealing portion 14 may be divided as a first sealing portion 141 disposed in the first area A1, a second sealing portion 142 disposed in the second area A2, and a third sealing portion 143 disposed in the third area A3.

The first sealing portion 141 may be disposed on the outside of the shielding layer 17, and at least a portion of the first sealing portion 141 may be connected to the shielding wall 15. The first sealing portion 141 may be a sealing portion of which a portion is removed along with the shielding wall 15 in the process of partially removing the shielding wall 15. A thickness of the first sealing portion 141 may be lower than a thickness of the second sealing portion 142. For example, a thickness (or a height) of the first sealing portion 141 may be configured to be equal to a height of the shielding wall 15.

The second sealing portion 142 may be disposed in the shielding layer 17. The second sealing portion 142 may have the second components 1b embedded therein.

The third sealing portion 143 may be disposed on the outside of the shielding layer 17, similarly to the first sealing portion 141, and may not have an electronic device or component embedded therein, and a conductive material may not be applied to a surface of the third sealing portion 143.

A thickness of the third sealing portion 143 may be configured to be different from a thickness of the second sealing portion 142. For example, the third sealing portion 141 may have a thickness lower than a thickness of the first sealing portion 141 or a thickness of the second sealing portion 142. However, the disclosure is not limited to such a configuration.

The third sealing portion 143 may be disposed along an edge of the substrate 11. The third sealing portion 143 may be disposed along an edge of the substrate 11 and be formed to have a shape of a square. However, the disclosure is not limited to such a configuration.

The antenna 20 may be disposed on a second surface of the substrate 11 or inside the substrate 11. The antenna 20 may be disposed in a position opposing the third sealing portion 143 and between two surfaces of the substrate 11.

The notion that the antenna 20 is disposed to oppose or face the third sealing portion 143 may indicate that, when the antenna 20 is disposed on the first surface of the substrate 11, the antenna 20 may overlap with the third sealing portion 143.

In the case in which the antenna 20 is disposed in an area opposing the first sealing portion 141 or the second sealing portion 142, a wireless signal transmitted and received via the antenna 20 may be shielded by the shielding wall 15 or the shielding layer 17. The antenna 20 may only be disposed on a lower portion of the third sealing portion 143 in which the shielding wall 15 or the shielding layer 17 is not present.

However, the disclosure is not limited to such a configuration. In the case in which the antenna 20 is configured to radiate a wireless signal to a lower portion of the substrate 11, the antenna may be disposed on a lower portion of the first sealing portion 141 or the second sealing portion 142.

For example, in the case in which a dipole antenna radiating a wireless signal in a direction parallel the substrate 11 is disposed, it may be favorable to dispose the antenna 20 in the area (A3) opposing the third sealing portion 143. However, in the case of disposing a patch antenna radiating a wireless signal in a lower portion direction among directions perpendicular to the substrate 11, it may be possible to dispose the antenna 20 in the areas A1 and A2 opposing the first sealing portion 141 and the second sealing portion 142.

The antenna 20 may be formed using a circuit pattern formed on the substrate 11. However, the antenna is not limited to such a configuration. For example, it may be possible to mount an individually manufactured antenna component on the second surface of the substrate 11, or other various modifications may be possible.

The shielding layer 17 disposed between the second sealing portion 142 or the third sealing portion 143 may be electrically connected to the ground electrode 19 on the substrate 11.

In the case of the method of manufacturing an electronic device module, after the processes in FIG. 11, a process of allowing the ground electrode 19 to be exposed to the outside of the sealing portion 14 by removing the sealing portion 14 in a form of a slit along a boundary between the second sealing portion 142 or the third sealing portion 143, and a process of forming the shielding layer 17 on a surface of the second sealing portion 142 and inside the slit may be undertaken sequentially. Thereafter, the sealing portion 14 in the third area A3 may be removed by reducing a thickness of the sealing portion 14 using a grinder, and the third sealing portion 143 may be manufactured accordingly.

In the electronic device module, an antenna may be disposed in an area in which the shielding layer 17 is not disposed, and thus, electronic components may be protected while maintaining a radiation performance of the antenna.

In the electronic device module, a shielding wall may be disposed between a first component and a second component, and accordingly, electromagnetic wave interference between the first component and the second component may be prevented.

As the shielding wall is formed between the first component and the second component using a shielding case, it may be easy to mount and manufacture the shielding wall.

When manufacturing a sealing portion, the shielding wall may perform a function of shielding a flow of the sealing portion as well, and thus, a gap between the sealing portion and the first component may be significantly reduced.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. An electronic device module comprising:
   a substrate;
   a sealing portion disposed on a first surface of the substrate;
   a first component disposed outside of the sealing portion on the first surface of the substrate;
   a second component disposed on the first surface of the substrate and embedded in the sealing portion; and
   a shielding wall at least partially disposed between the first component and the second component, and comprising a portion having a height, with respect to the first surface of the substrate, that is lower than a height of the sealing portion.

2. The electronic device module of claim 1, wherein the shielding wall and the first component are spaced apart with an empty space therebetween, and the sealing portion is disposed between the shielding wall and the second component.

3. The electronic device module of claim 1, wherein the shielding wall is a square ring, and the first component is disposed in an internal space defined by the shielding wall.

4. The electronic device module of claim 1, wherein the shielding wall comprises two walls connected to each other, and at least one of the two walls is disposed between the first component and the second component.

5. The electronic device module of claim 1, wherein the shielding wall extends across an entire width of the first surface of the substrate.

6. The electronic device module of claim 1, wherein the substrate comprises a ground electrode, and the shielding wall is bonded to the ground electrode.

7. The electronic device module of claim 1, further comprising:
   a shielding layer disposed along a surface of the sealing portion.

8. The electronic device module of claim 7, wherein the shielding layer is connected to an upper end of the shielding wall.

9. The electronic device module of claim 7, wherein the shielding layer and the shielding wall are formed of different materials.

10. The electronic device module of claim 7, wherein the sealing portion comprises a first sealing portion without the shielding layer and connected to the shielding wall, a second sealing portion provided with the shielding layer, and a third sealing portion without the shielding layer and having a thickness, with respect to the first surface of the substrate, that is less than a thickness of the first sealing portion and a thickness of the second sealing portion, and
   further comprising an antenna disposed on or in a portion of the substrate that overlaps the third sealing portion.

11. A method of manufacturing an electronic device module, comprising:
   mounting a first component and a second component on a first surface of a substrate;
   mounting a shielding case formed of a conductive material and defining a receiving space on the first surface of the substrate so that the first component is accommodated in the receiving space;
   disposing a sealing portion sealing the second component and the shielding case on the first surface of the substrate; and
   exposing the receiving space to the outside of the sealing portion by partially removing the sealing portion and the shielding case.

12. The method of claim 11, further comprising:
forming a shielding layer on a surface of the sealing portion before exposing the receiving space to the outside of the sealing portion.

13. The method of claim 12, wherein the forming of the shielding layer comprises partially exposing the shielding case by partially removing the sealing portion, and disposing the shielding layer on a surface of the sealing portion and the partially exposed shielding case.

14. The method of claim 13, wherein the partially exposing of the shielding case is performed by removing an upper surface of the sealing portion using a grinder until the shielding case is exposed.

15. The method of claim 13, wherein the partially exposing of the shielding case is performed by exposing only a portion of the shielding case that corresponds to a wall disposed between the first component and the second component using a blade or a laser.

16. The method of claim 11, wherein the exposing of the receiving space to the outside of the sealing portion comprises partially removing the sealing portion and the shielding case using a grinder.

17. An apparatus comprising:
an electronic device module comprising
a substrate,
a sealing portion disposed on the first surface of the substrate,
a first component disposed outside of the sealing portion on the first surface of the substrate,
a second component disposed on the first surface of the substrate and embedded in the sealing portion,
a shielding structure at least partially disposed between the first component and the second component, and
an antenna disposed on a second surface of the substrate opposite the first surface or inside the substrate at a position that overlaps the first component.

18. The apparatus of claim 17, wherein the shielding structure comprises a first wall disposed between the first component and the second component.

19. The apparatus of claim 18, wherein the first wall has a height above the first surface of the substrate that is shorter than a height of the sealing portion.

20. The apparatus of claim 18, wherein the shielding structure comprises a second wall, the first wall has a height above the first surface of the substrate that is equal to a height of the sealing portion, and the second wall has a height above the first surface of the substrate that is shorter than the height of the sealing portion.

* * * * *